(12) United States Patent
Morikawa

(10) Patent No.: US 6,777,703 B2
(45) Date of Patent: Aug. 17, 2004

(54) FABRICATION METHOD OF OPTICALLY COUPLED DEVICE

(75) Inventor: Hiroaki Morikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 209 days.

(21) Appl. No.: 10/186,423

(22) Filed: Jul. 2, 2002

(65) Prior Publication Data

US 2003/0015644 A1 Jan. 23, 2003

(30) Foreign Application Priority Data

Jul. 18, 2001 (JP) ........................................ 2001-218505

(51) Int. Cl.[7] .............................................. G02B 27/00
(52) U.S. Cl. ............................ 250/551; 257/80; 438/25
(58) Field of Search ................................ 250/551, 239, 250/206.1; 257/80, 81, 82, 83, 84, 432, 433, 678; 438/24, 25, 106

(56) References Cited

U.S. PATENT DOCUMENTS 5,285,076 A * 2/1994 Kusuda et al. .............. 250/551

6,507,035 B1 * 1/2003 Hasegawa et al. .......... 250/551

FOREIGN PATENT DOCUMENTS

JP 4-262543 9/1992

* cited by examiner

Primary Examiner—Kevin Pyo
(74) Attorney, Agent, or Firm—Birch, Stewart, Kolasch & Birch, LLP

(57) ABSTRACT

By altering the assembly condition (for example, frame bent depth, type and height of precoat resin, type of mold resin) of an optically coupled device, the quantity of light arriving at a photodetector (for example, a phototransistor) from a photoemitter (for example, an infrared-emitting diode) is set to be a value within a predetermined range. As a result, an optically coupled device having a current transmission rate within a particular range can be fabricated, independent of the performance of the photoemitter and the performance of the photodetector. Thus, the yield of the optically coupled device can be improved.

11 Claims, 7 Drawing Sheets

CTR=IC/IF × 100[%]

FABRICATION METHOD OF OPTICALLY COUPLED DEVICE

BACKGROUND OF THE INVENTION

1. Field of the Invention

The present invention relates to a method of fabricating an optically coupled device having an assembly of a photoemitter that emits light of a predetermined level according to a flow of input current and a photodetector that receives the light from the photoemitter to provide output current.

2. Description of the Background Art

An optically coupled device is conventionally fabricated using a photoemitter and a photodetector. In the fabrication of an optically coupled device, there is variation in the characteristics of the photoemitter as well as in the photodetector. By the synergistic effect of the variation in both the characteristics of the photoemitter and the photodetector, the variation in the characteristics of the optically coupled device is significantly increased.

A plurality of photoemitters are fabricated from one semiconductor wafer. Also, a plurality of photodetectors are fabricated from one semiconductor wafer. The characteristics of the plurality of photoemitters are tested for every one wafer in preparation for the fabrication of an optically coupled device. Also, the characteristics of the plurality of photodetectors are tested for every one wafer in preparation for the fabrication of an optically coupled device.

Only a photoemitter whose variation range in characteristics is smaller than the entire variation permissible range of characteristics of a photoemitter based on the characteristic test of each wafer is used in the fabrication of an optically coupled device.

Also, only a photodetector whose variation range in characteristics is smaller than the entire variation permissible range of characteristics of a photodetector based on the characteristic test of each wafer is used in the fabrication of an optically coupled device.

Thus, measures are taken so that the variation range in characteristics of an optically coupled device is below a desired level as to optically coupled devices whose variation range in characteristics is increased by the synergistic effect of the variation in characteristics of both the photoemitter and the photodetector.

In the fabrication of a conventional optically coupled device, various processes such as the photoemitter and photodetector fabrication process, the photoemitter and photodetector test process, the optically coupled device assembly process (die-bonding, wire-bonding, precoating, molding and the like), the optically coupled device test process, and the packaging process are respectively controlled by an independent computer.

Due to the synergistic effect of variation in characteristics of a photoemitter and a photodetector, the variation in characteristics of an optically coupled device will become greater than the entire variation in characteristics of a photoemitter and the entire variation in characteristics of a photodetector.

In the case where a certain photoemitter and a certain photodetector are combined, there is a possibility of the assembled optically coupled device having a value of characteristics outside the permissible range despite each certain photoemitter unit and photodetector unit having a characteristic variation within the permissible range. In such a case, the yield of the optically coupled device is degraded.

Furthermore, in order to improve the yield of the optically coupled device, it is necessary to set the variation in the characteristics of the photoemitter unit and the photodetector unit to be with in an extremely small range taking into account the synergistic effect of the variation in characteristics of both the photoemitter and the photodetector.

However, if the respective variations in characteristics of the photoemitter unit and the photodetector unit are set to be within an extremely small range, there is a disadvantage that the respective yields of the photoemitter and the photodetector will be degraded.

A specific example of this disadvantage will be described based on a photocoupler including an infrared-emitting diode and i phototransistor.

Referring to FIG. 7, a photocoupler 1 has an infrared-emitting diode 2 die-bonded to a frame 4, and a phototransistor 3 die-bonded to a frame 5. Infrared-emitting diode 2 is molded by a precoat resin 6.

Infrared-emitting diode 2 and phototransistor 3 are disposed facing each other. Frames 4 and 5, infrared-emitting diode 2 and phototransistor 3 are molded by a first mold resin 7 and a second mold resin 8.

When a current is input (referred to as "IF" hereinafter: unit [A]) to infrared-emitting diode 2 from a first circuit at the input side as shown in FIG. 8 in photocoupler 1, infrared light is output from infrared-emitting diode 2.

This infrared light is received by phototransistor 3. Upon receiving infrared light, phototransistor 3 conducts a flow of an output current (referred to as "IC" hereinafter: unit [A]) at a predetermined amplification factor (referred to as "hFE" hereinafter) to a second circuit at the output side.

By the above-described mechanism, photocoupler 1 can transmit an electrical signal from the first circuit to the second circuit with the first circuit at the input side insulated from the second circuit; at the output side. In photocoupler 1, the ratio of IC to IF, i.e., IC/IF×100 is called the current transmission rate (referred to as "CTR" hereinafter: unit [%]).

When an electronic circuit is fabricated using photocoupler 1, the circuitry must be designed taking into account the change in the CTR due to temperature and over time. The designing of circuitry employing photocoupler 1 will become easier as the range of change in CTR is smaller.

The CTR of photocoupler 1 is generally determined by the amount of light (quantity of light) arriving at phototransistor 3 (quantity of light referred to as "PO" hereinafter) among the light output from infrared-emitting diode 2 and the hFE of phototransistor 3.

This means that the variation range of CTR is extremely increased due to the synergistic effect of the variation of PO and the variation of hFE. As a result, the yield of photocoupler 1 with respect to CTR will be degraded.

Infrared-emitting diode 2 is fabricated by epitaxial growth for every one batch formed of n wafers. However, the quantity of light of infrared-emitting diode 2 in each wafer of one batch is actually variable, as shown in FIG. 9. This means that the variation in the PO distribution of each of the n wafers is not equal even in the case where epitaxial growth is conducted in the same one batch.

Furthermore, the actual quantity of light of infrared-emitting diode 2 per one batch varies as shown in FIG. 10. The variation in the PO distribution per 1 batch becomes greater than the quantity of light variation of each wafer in one batch.

Therefore, the total variation of the PO distribution of infrared-emitting diode 2 that is used by the manufacturer of photocoupler 1 will become further greater than the quantity of light variation of each wafer in one batch and the quantity of light variation per one batch, as shown in FIG. 11.

The same can be said for the fabrication of a phototransistor. The total variation in the hFE distribution shown in FIG. 14 is greater than the hFE distribution variation of each wafer shown in FIG. 12 and the hFE distribution variation for one batch shown in FIG. 13.

In the present state of affairs, the hFE range of the phototransistor can be specified during fabrication of a photocoupler. However, the PO range of the infrared-emitting diode cannot be specified.

Therefore, a photocoupler 1 having a combination of a phototransistor 3 of a large hFE and an infrared-emitting diode 2 of a large PO will exhibit an extremely large CTR. In contrast, a photocoupler 1 having a combination of a phototransistor 3 of a small hFE and an infrared-emitting diode 2 of a small PO will exhibit in an extremely small CTR.

By the synergistic effect of the variation in characteristics of an infrared-emitting diode and variation in characteristics of a phototransistor, it is difficult to fabricate a photocoupler whose variation range of CTR is within a particular range. As a result, it is difficult to improve the yield of a photocoupler with respect to CTR.

SUMMARY OF THE INVENTION

An object of the present invention is to provide a method of fabricating an optically coupled device that can have the yield of optically coupled devices improved.

The optically coupled device fabrication method according to the present invention is directed to a method of fabricating an optically coupled device having an assembly of a photoemitter that issues light of a predetermined level according to a flow of input current and a photodetector that receives the light from the photoemitter to provide an output current.

The fabrication method of an optically coupled device of the present invention includes one or more current transmission rate calculation steps of calculating a current transmission rate that is a ratio of output current to input current under a presumptive assembly condition, and one or more determination steps of determining whether the current transmission rate in each of the one or more current transmission rate calculation steps is a value within a particular range.

When determination is made that the current transmission rate is not within the particular range in each of the one or more determination steps, the presumptive assembly condition is modified to another assembly condition so that the current transmission rate becomes a value in the particular range or approximates the particular range. The one or more determination steps is carried out until the current transmission rate becomes a value in the particular range.

In the method of fabricating an optically coupled device of the present invention, a photoemitter and a photodetector are eventually assembled under an assembly condition where the current transmission rate is within the particular range.

By the fabrication method of the present invention, the current transmission rate can be set to be within a particular range by adjusting the assembly condition, independent of the performance of the photoemitter and the performance of the photodetector. As a result, the yield of optically coupled devices can be improved.

In the case where determination is made that the current transmission rate is a value within the particular range at the first determination step of the one or more determinations steps in the method of fabricating an optically coupled device of the present invention, the photoemitter and the photodetector are assembled under the presumptive assembly condition.

The method of fabricating an optically coupled device of the present invention can include an arriving light quantity measurement step of measuring a quantity of light arriving at the photodetector among the emitted light, and an amplification factor measurement step of measuring an amplification factor that is a ratio of the output current to the quantity of arriving light. In the current transmission rate calculation step, the current transmission rate can be calculated using the measured result of the arriving light quantity measurement step and the measured result of the amplification factor measurement step.

By the present fabrication method, a current transmission rate can be calculated using the arriving light quantity measurement step normally carried out in the product test of photoemitters, and the amplification factor measurement step normally carried out in the product test of photodetectors. Accordingly, increase in the number of steps in the fabrication process of an optically coupled device can be suppressed In the method of fabricating an optically coupled device of the present invention, the arriving light quantity measurement step can be conducted at a stage before the photoemitter is affixed to a frame, and the amplification factor measurement step can be conducted at a stage before the photodetector is affixed to a frame.

The present fabrication method prevents the disadvantage of the step of affixing a photoemitter to a frame or a photodetector to a frame being wasted when there is a fault in the photoemitter and photodetector that cannot be recovered by modifying other conditions.

In the method of fabricating an optically coupled device of the present invention, the arriving light quantity measurement step can be conducted at a stage after the photoemitter is affixed to a frame, and the amplification factor measurement step can be conducted at a stage after the photodetector is affixed to a frame.

According to the present method, the quantity of arriving light can be measured in a state where the photoemitter is actually affixed to a frame. Therefore, the quantity of arriving light can be measured under a state closer to that of an optically coupled device that is the eventual product, as compared to the case where the quantity of arriving light is measured at a stage before the photoemitter is affixed to the frame.

Furthermore, since the amplification factor is measured under a state where the photodetector is actually affixed to the frame, the amplification factor can be measured in a state closer to the state of the optically coupled device that is the eventual product, as compared to the case where the amplification factor is measured at a stage before the photodetector is affixed to the frame.

In the method of fabricating an optically coupled, device of the present invention, the presumptive assembly condition can be modified by modifying the state of at least one of the frame where the photoemitter is affixed and the frame where the photodetector is affixed.

By the present fabrication method, modification of the presumptive assembly condition can be controlled more easily, as compared to the case where the presumptive assembly condition is modified by modifying the state of the resin as will be set forth below.

In the method of fabricating an optically coupled device of the present invention, the presumptive assembly condition can be modified by altering the resin having a predetermined translucence, provided between the photoemitter and the photodetector, to another resin having a different translucence.

By the present fabrication method, the presumptive assembly condition can be modified without changing the structure of the optically coupled device, as compared to the case where the pressumptive assembly condition is modified by changing the frame state. This eliminates the possibility of a change in structure affecting the characteristics of the optically coupled device.

In the method of fabricating an optically coupled device of the present invention, the presumptive assembly condition can be modified by altering the length of the resin provided between the photoemitter and the photodetector. This length is referenced to the direction connecting the photodetector and the photoemitter.

According to the present fabrication method, the assembly condition can be modified by a more simple operation, as compared to the case where the presumptive assembly condition is modified by changing the resin having a predetermined translucence to another resin of a different translucence or the case where the presumptive assembly condition is modified by altering the frame state.

The photoemitter may be any of a semiconductor infrared photoemitter, a semiconductor visible light photoemitter, and a semiconductor laser device.

The photodetector may be any of a photodiode, a phototransistor, a photo Darlington transistor, a phototriac, a photothyristor, a photoMOS (Metal Oxide Semiconductor), and a photoIC (Integration Circuit).

The optically coupled device may be any of a photocoupler, a phototriac coupler, a photothyrister coupler, and a photointerruptor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An optically coupled device according to embodiments of the present invention will be described hereinafter with reference to the drawings.

Figure 1:
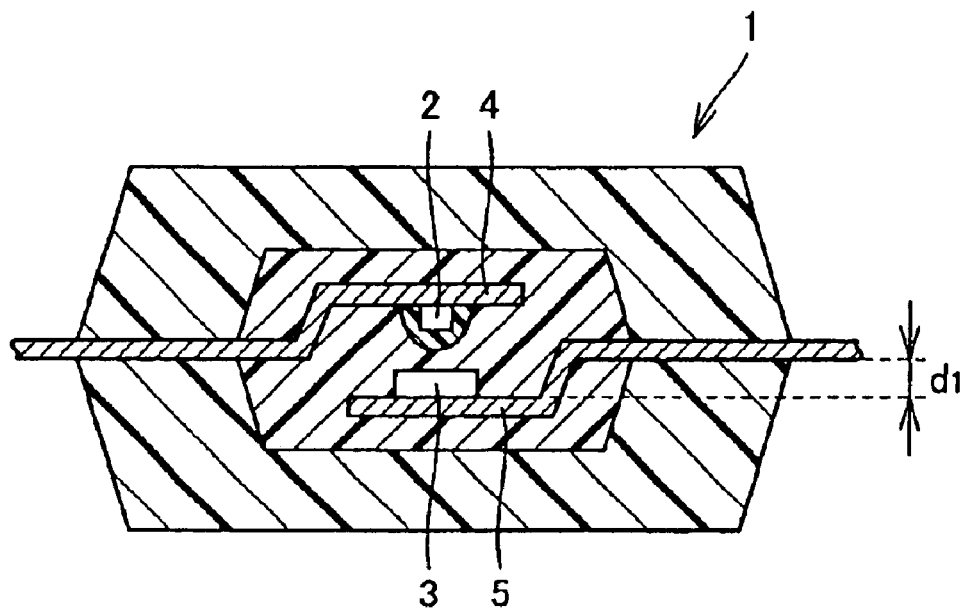
FIG. 1 is a diagram to describe the relationship between the bent depth (when shallow) of the frame employed in the assembly of a photocoupler and the quantity of light arriving at the phototransistor from the infrared-emitting diode.

In a method of fabricating an optically coupled device of the present invention, an infrared-emitting diode 2 is employed as a photoemitter, and a phototransistor 3 is employed as a photodetector, as shown in FIG. 1.

First Embodiment

A method of fabricating an optically coupled devise of the present embodiment will be described with reference to FIGS. 1–5.

In the method of fabricating an optically coupled device of the present embodiment, characteristic data (PO) for each wafer or for each batch of infrared-emitting diode 2 is measured. The measured data is stored in a predetermined storage device in units of quantity appropriate for management in the fabrication process.

Then, characteristic data (hFE) for each wafer or for each batch of phototransistor 3 is measured. The measured data is stored in a predetermined storage device in units of quantity appropriate for management in the fabrication process.

Based on the characteristic data (PO, hFE) stored in the storage device, an appropriate combination of infrared-emitting diode 2 and phototransistor 3 is selected so that the CTR is within a range of a desired level. The selected infrared-emitting diode 2 and phototransistor 3 are die-bonded. Accordingly, photocoupler 1 whose CTR is within a desired range is fabricated.

When infrared-emitting diode 2 has a large PO and phototransistor 3 has a large hFE, photocoupler 1 will exhibit an extremely high CTR. Therefore, when a photocoupler 1 of a low CTR is required, there may be an event where a photocoupler having a CTR in a desired range cannot be fabricated by just changing the combination of infrared-emitting diode 2 and phototransistor 3.

In the fabrication method of the present embodiment, a photocoupler having a CTR in the desired range is fabricated by altering the quantity of light arriving at phototransistor 3 from infrared-emitting: diode 2 (amount of arriving light) through the method set forth below when infrared-emitting diode 2 and phototransistor 3 are to be assembled.

Altering the quantity of light arriving at phototransistor 3 from infrared-emitting diode 2 will be described hereinafter.

Figure 2:
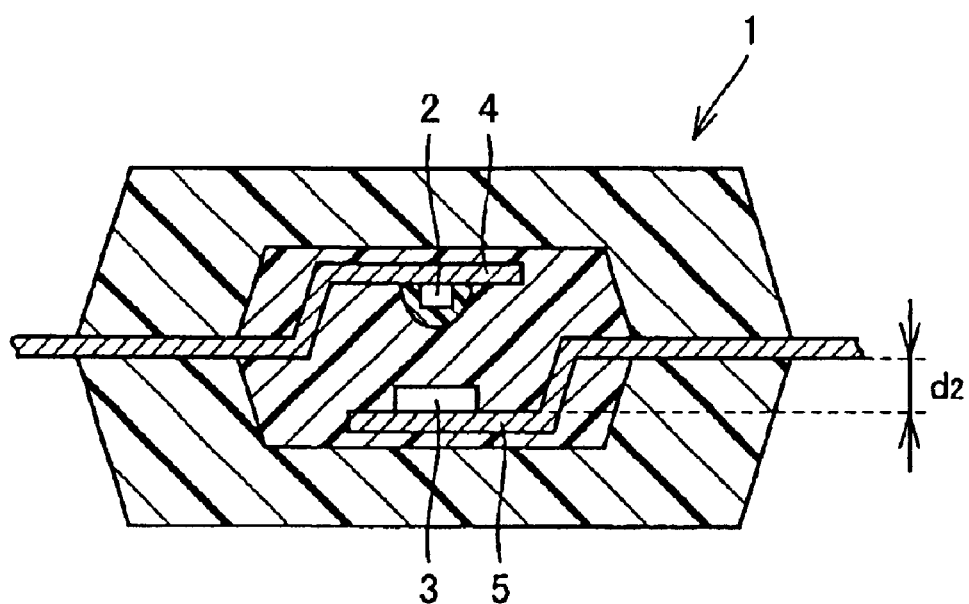
FIG. 2 is a diagram to describe the relationship between the bent depth (when deep) of the frame employed in the assembly of a photocoupler and the quantity of light arriving at the phototransistor from the infrared-emitting diode.

In photocoupler 1 as shown in FIGS. 1 and 2, the quantity of light arriving at phototransistor 3 from infrared-emitting diode 2 decreases in inverse proportion to the second power of distance between infrared-emitting diode 2 and phototransistor 3. As a result, the CTR becomes smaller in inverse proportion to the second power of distance between infrared-emitting diode 2 and phototransistor 3.

In view of the foregoing, a plurality of types of frames 4 and 5 having different frame bent depth d are prepared, as shown in FIGS. 1 and 2, in the first fabrication method of a photo coupler 1 of the present embodiment. The bent depth $d_1$ of frames 4 and 5 of FIG. 1 is smaller than the bent depth $d_2$ of frames 4 and 5 shown in FIG. 2.

The relationship between bent depths $d_1$ and $d_2$ of frames 4 and 5 and the quantity of light arriving at phototransistor 3 from infrared-emitting diode 2 is obtained in advance. At the eventual stage of assembling infrared-emitting diode 2 and phototransistor 3, frames 4 and 5 of an appropriate bent depth d that causes the quantity of light arriving at phototransistor 3 from infrared-emitting diode 2 to be within a predetermined range are selected.

Even in the case where the PO variation of infrared-emitting diode 2 is biased to the larger side (smaller side) and the hFE variation of phototransistor 3 is biased to the larger side (smaller side) according to the initially predetermined assembly condition, a photocoupler 1 having a CTR in the desired range can be fabricated by the first fabrication method of the present embodiment by modifying the assembly condition so as to alter the quantity of light arriving at phototransistor 3 from infrared-emitting diode 2.

Figure 3:
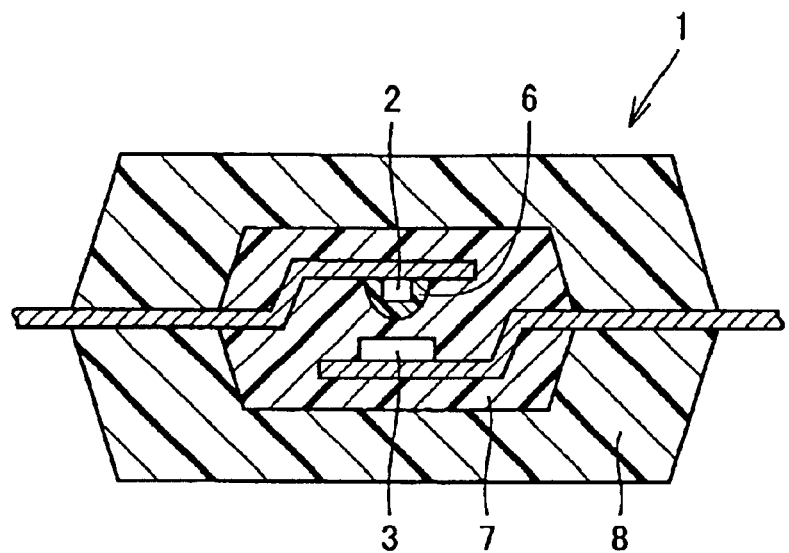
FIGS. 3 and 4 are diagrams to describe the relationship between the amount of precoat resin when high and low employed in the assembly of a photocoupler and the quantity of light arriving at the phototransistor from the infrared-emitting diode.
Figure 4:
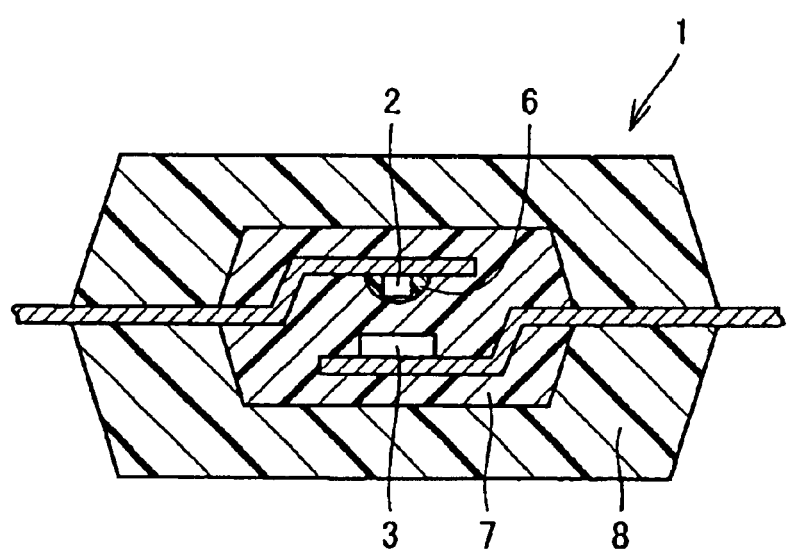

As another method of altering the quantity of light arriving at phototransistor 3 from infrared-emitting diode 2, the method of altering the translucence of precoat resin 6 employed in the assembly of infrared-emitting diode 2 and phototransistor 3 shown in FIGS. 3 and 4 is possible.

Generally when infrared-emitting diode 2 is molded using precoat resin 6 of low translucence, the quantity of light arriving at phototransistor 3 from infrared-emitting diode 2 decreases. In other words, the CTR becomes lower if infrared-emitting diode 2 is molded using a precoat resin 6 of low translucence.

In the second fabrication method of photocoupler 1 of the present embodiment, a plurality of types of precoat resin 6 having different translucence are prepared. The relationship between the translucence of precoat resin 6 and the quantity of light arriving at phototransistor 3 from infrared-emitting diode 2 is obtained in advance.

At the eventual stage of assembling infrared-emitting diode 2 and phototransistor 3, a precoat resin 6 of a translucence that causes the quantity of light arriving at phototransistor 3 from infrared-emitting diode 2 to be within a predetermined range is selected.

As a result, even in the case where the PO variation of infrared-emitting diode 2 is biased to the larger side (smaller side) and the hFE variation of phototransistor 3 is biased to the larger side (smaller side) according to the presumptive assembly condition, a photocoupler 1 having a CTR in the desired range can be fabricated according to the second fabrication method of the present embodiment by modifying the assembly condition so that the quantity of light arriving at phototransistor 3 from infrared-emitting diode 2 is altered.

As another method of altering the quantity of light arriving at phototransistor 3 from infrared-emitting diode 2, the method of altering the height of precoat resin 6 (the length of the precoat resin in the direction connecting infrared-emitting diode 2 and phototransistor 3) employed in the assembly of infrared-emitting diode 2 and phototransistor 3 shown in FIGS. 3 and 4 is possible.

By lowering the height of precoat resin 6, the quantity of light arriving at phototransistor 3 from infrared-emitting diode 2 can be generally reduced. In other words, the CTR value becomes smaller as the height of precoat resin 6 is lowered. It is to be noted that the height of precoat resin 6 in FIG. 3 is higher than the height of precoat resin 6 in FIG. 4.

In the third fabrication method of the present embodiment, first the relationship between the amount (height) of precoat resin 6 and the quantity of light arriving at phototransistor 3 from infrared-emitting diode 2 is obtained in advance. When infrared-emitting diode 2 and phototransistor 3 are to be assembled, infrared-emitting diode 2 is covered with precoat resin 6 of an amount (height) that causes the quantity of light arriving at phototransistor 3 from infrared-emitting diode 2 to be within a predetermined range.

Even in the case where the P0 variation of infrared-emitting diode 2 is biased to the larger side (smaller side) and the hFE variation is of phototransistor 3 is biased to the larger side (smaller side) according to the presumptive assembly condition, a photocoupler 1 having a CTR in the desired range can be fabricated by the third fabrication method of the present embodiment by altering the assembly condition so that the quantity of light arriving at phototransistor 3 from infrared-emitting diode 2 is changed.

As another method of altering the quantity of light arriving at phototransistor 3 from infrared-emitting diode 2, the method of altering the translucence of the first mold resin 7 employed in the assembly of infrared-emitting diode 2 and phototransistor 3 is possible.

In general, if the translucence of first mold resin 7 shown in FIGS. 3 and 4 is low, the quantity of light arriving at phototransistor 3 from infrared-emitting diode 2 is reduced In other words, the CTR becomes smaller if the translucence of first mold resin 7 is low.

According to the fourth fabrication method of the present embodiment, first mold resins 7 having different translucence are prepared. The relationship between the translucence of each first mold resin 7 and the quantity of light arriving at phototransistor 3 from infrared-emitting diode 2 is obtained.

In the eventual stage of assembling infrared-emitting diode 2 and phototransistor 3, a first mold resin 7 of a translucence that causes the quantity of light arriving at phototransistor 3 from infrared-emitting diode 2 to be within a predetermined range is selected.

Even in the case where the PO variation of infrared-emitting diode 2 is biased to the larger side (smaller side) and the hFE variation of phototransistor 3 is biased to the larger side (smaller side) according to the presumptive assembly condition, a photocoupler 1 having a CTR in the desired range can be fabricated according to the fourth fabrication method by modifying the assembly condition so that the quantity of light arriving at phototransistor 3 from infrared-emitting diode 2 is altered.

A specific example of a fabrication process of a photocoupler according to the first embodiment using wafer test data will be described hereinafter with reference to the flow chart of FIG. 5.

The fabrication process of photocoupler 1 includes the test process of infrared-emitting diode 2 and phototransistor 3 (wafer test data), the assembly process of infrared-emitting diode 2 and phototransistor 3 (die-bonding, wire-bonding, precoating, first and second molding), characteristic test process of photocoupler 1 (CTR measurement and the like), and the packaging process of photocoupler 1.

Figure 5:
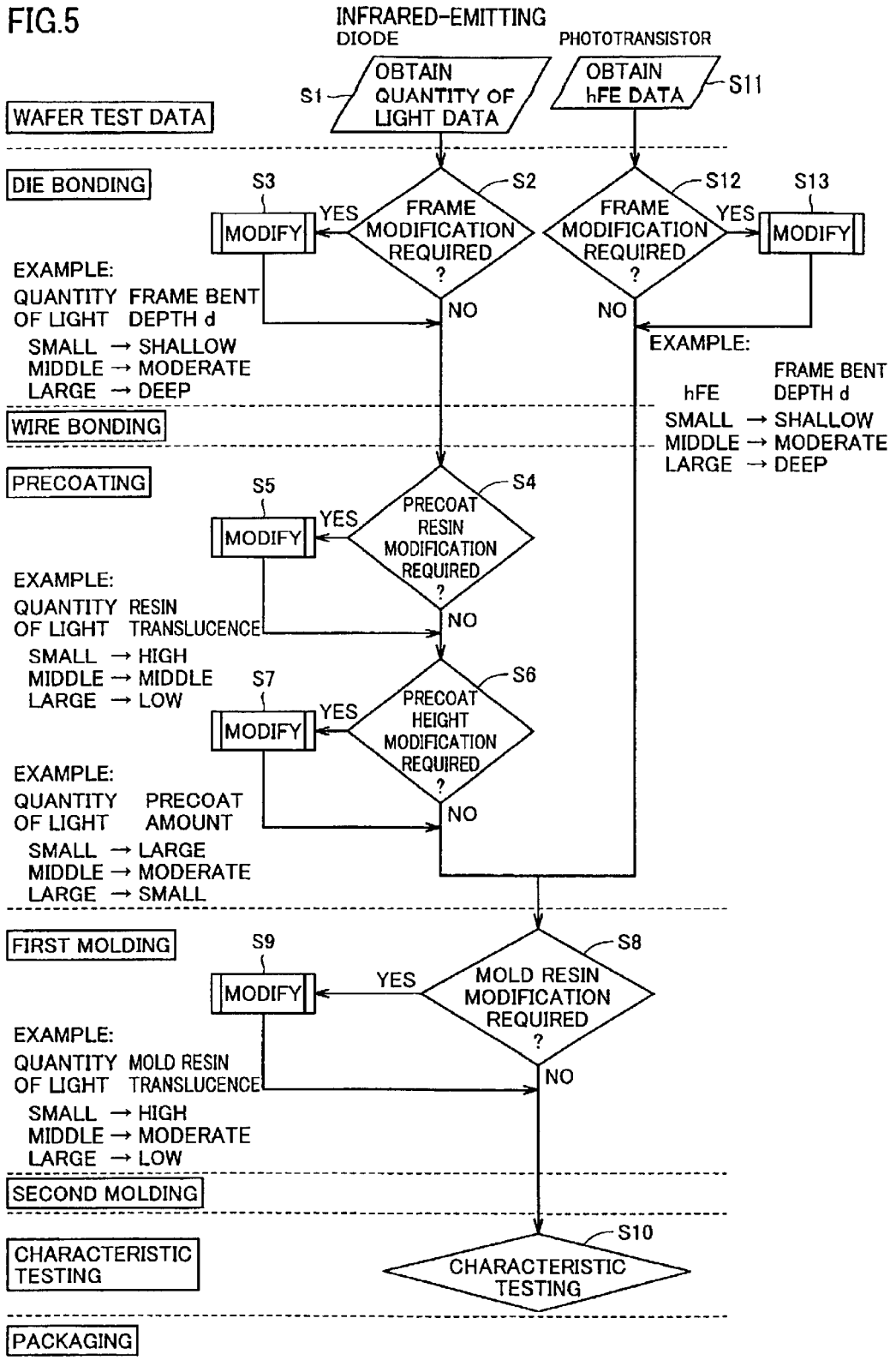
FIG. 5 is a flow chart of a specific example of a fabrication process of a photocoupler using wafer test data.

In the fabrication process of a photocoupler 1 of FIG. 5, it is possible to employ an efficient combination corresponding to the fabrication plan of the photocoupler among the above-described first to fourth fabrication methods of altering the quantity of light arriving at phototransistor 3 from infrared-emitting diode 2 in the assembly of infrared-emitting diode 2 and phototransistor 3.

In the fabrication process of a photocoupler shown in FIG. 5, the PO of infrared-emitting diode 2 and the hFE of phototransistor or 3 are respectively divided into three stages, i.e., "large", "middle", and "small". However, the number of stages is not limited thereto. The PO of infrared-emitting diode 2 and the hFE of phototransistor 3 can be further divided depending upon the required assembly condition for fabrication of photocoupler 1.

A specific flow of the fabrication process of photocoupler 1 will be described hereinafter with reference to FIG. 5.

First, the PO data of infrared-emitting diode 2 and the hFE data of phototransistor 3 (both of wafer test data) are obtained (steps S1 and S11).

Then, the PO data of infrared-emitting diode 2 and the hFE data of phototransistor 3 are respectively written into a wafer map. The data written into the wafer map is stored in a storage device via a computer network such as the Internet.

Based on the PO data of infrared-emitting diode 2 and the hFE data of phototransistor 3 as well as the data of the CTR required for photocoupler 1, a combination of infrared-emitting diode 2 and phototransistor 3 to be die-bonded is evaluated.

Then, determination is made whether it is necessary to modify the bent depth of a frame 4 for infrared-emitting diode 2 (refer to FIGS. 1 and 2) (step S2). The determination of whether the bent depth of frame 4 is to be altered or not is based on whether the value of CTR is within a desired particular range.

When the CTR value is not within the particular range, the bent depth of frame 4 must be altered. When the CTR value is within the particular range, it is not necessary to alter the bent depth of frame 4.

When determination is made that the bent depth of frame 4 is to be altered at step S2, any of frames 4 and 5 having a bent depth of "shallow", "moderate" and "deep" are selected based on whether the level of the PO data of infrared-emitting diode 2 is "small", "middle" and "large" (step S3).

A "shallow" frame bent depth implies that the bent depth d shown in FIGS. 1 and 2 is large. A "deep" frame bent depth implies that the bent depth d shown in FIGS. 1 and 2 is small.

For example, when the PO data of infrared-emitting diode 2 is "small", a "shallow" frame bent depth is selected since it is necessary to reduce the distance between infrared-emitting diode 2 and phototransistor 3.

In contrast, when the PO data of infrared-emitting diode 2 is "large", a "deep" frame bent depth is selected since it is necessary to increase the distance between infrared-emitting diode 2 and phototransistor 3.

By step S3, the quantity of arriving light is modified so that the CTR value is within the particular range or so that the CTR value approximates the particular range.

A similar step is conducted for phototransistor 3. Determination is made whether it is necessary to alter the frame bent depth (refer to FIGS. 1 and 2) of frame 5 (step S12). This determination of whether to modify the bent depth of frame 5 is based on whether the CTR value is within a desired predetermined range.

When the CTR value is not within the predetermined range, the bent depth of frame 5 must be altered. When the CTR value is within the predetermined range, it is not necessary to alter the bent depth of frame 5.

In the case where determination is made that the frame bent depth is to be altered at step S12, any of frames 5 having a "shallow", "moderate" and "deep" frame bent depth is selected based on whether the hFE data of phototransistor 3 is "small", "middle" or "large" (step S13).

By step S13, the above-described quantity of arriving light is altered so that the CTR value is within a particular range or approximates the particular range.

Then, determination is made whether the type (translucence) of precoat resin 6 is to be altered or not based on the PO data of infrared-emitting diode 2 (step S4). This determination of whether to modify the translucence of precoat resin 6 is based on whether the CTR value is within a desired particular range.

When the CTR value is not within the particular range, the translucence of precoat resin 6 must be altered. When the CTR value is within the particular range, the translucence of precoat resin 6 does not have to be changed.

When determination is made that the translucence of precoat resin 6 is to be modified at step S4, precoat resin 6 of "high", "moderate" and "low" translucence is selected based on whether the PO data of infrared-emitting diode 2 is "small", "middle" or "large" (step S5).

By step S4, the above-described quantity of arriving light is modified so that the CTR value is within the particular range or approximates the particular range.

Then, determination is made whether the height of precoat resin 6 is to be altered or not based on the PO data of infrared-emitting diode 2 (step S6). This determination of whether to alter the height of precoat resin 6 is based on whether the CTR value is within a desired particular range.

When the CTR value is not within the particular range, the height of precoat resin 6 must be altered. When the CTR value is within the particular range, the height of precoat resin 6 does not have to be changed.

When determination is made that the height of precoat resin 6 is to be altered at step 6, precoat resin 6 of any of the precoat amount of "large", "moderate" and "small" is selected based on whether the PO data of infrared-emitting diode 2 is "small", "middle" or "large" (step S7).

By step S6, the above-described quantity of arriving light is modified so that the CTR value is within the particular range or approximates the particular range.

Then, determination is made whether the type (translucence) of first mold resin 7 is to be altered or not based on the PO data of infrared-emitting diode 2 and the hFE data of phototransistor 3 (step S8). This determination of whether the translucence of first mold resin 7 is to be altered or not is based on whether the CTR value is within a desired particular range.

When the CTR value is not within the particular range, the translucence of first mold resin 7 must be altered. When the CTR value is within the particular range, the translucence of first mold resin 7 does not have to be altered.

In the case where the mold resin has to be modified, a first mold resin 7 having a "high", "moderate" and "low" translucence is selected based on whether the PO data of infrared-emitting diode 2 is "small", "middle" and "large" (step S9). A molding process is effected using the selected first mold resin 7.

By step S9, the above-described quantity of arriving light is modified so that the CTR value is within the particular range or approximates a value in the particular range.

Following the second molding step, the characteristic test process of photocoupler 1 is conducted (step S10). When determination is made that first mold resin 7 does not have to be altered, a mold process is conducted using the normal first mold resin 7 and second mold resin 8, followed by a characteristic test process of photocoupler 1 (step S10).

In the method of fabricating a photocoupler shown in FIG. 5, the step of determining whether to alter the quantity of arriving light is carried out several times. However, in the case where the CTR value is within the desired particular range at the first determination step, the determination step is ended at the first time, and a photocoupler can be fabricated without altering the quantity of arriving light.

Second Embodiment

A method of fabricating a photocoupler according to a second embodiment of the present invention will be described hereinafter with reference to FIG. 6.

In the case where it is difficult to transfer the characteristic data (PO) of infrared-emitting diode 2 and the characteristic data (hFE) of phototransistor 3 between the manufacturing plants of infrared-emitting diode 2 or phototransistor 3 and the manufacturing plant of photocoupler 1, the characteristic data of infrared-emitting diode 2 or the characteristic data of phototransistor 3 may have to be measured in detail at the manufacturing plant of photocoupler 1.

In this case, the characteristic data of infrared-emitting diode 2 and the characteristic data of phototransistor 3 are respectively measured after infrared-emitting diode 2 is die-bonded to frame 4 and phototransistor 3 is die-bonded to frame 5.

A specific example of the fabrication process of a photocoupler according to the second embodiment will be described with reference to the flow chart of FIG. 6.

Figure 6:
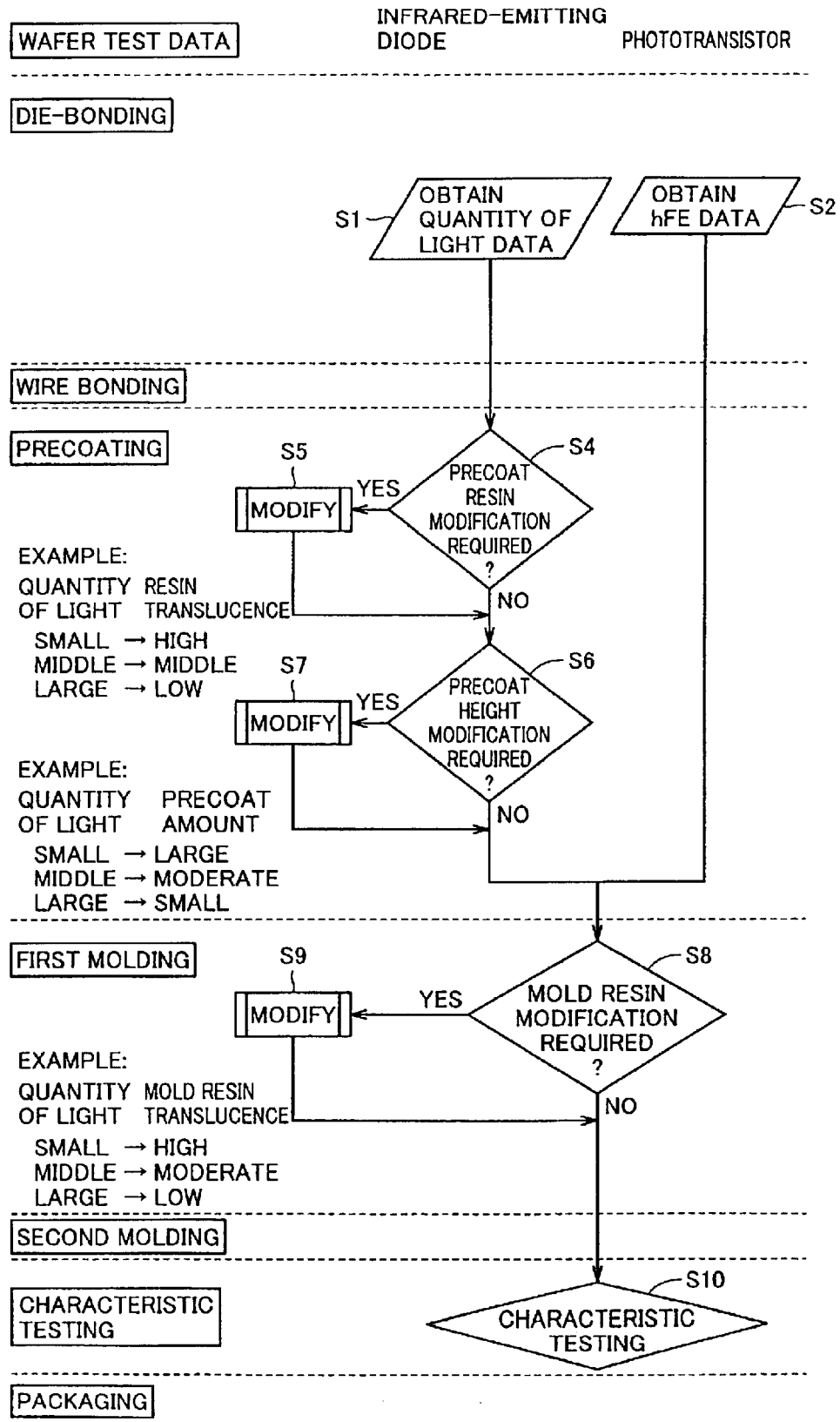
FIG. 6 is a flow chart of a specific example of a fabrication process to obtain characteristic data after die bonding.
Figure 7:
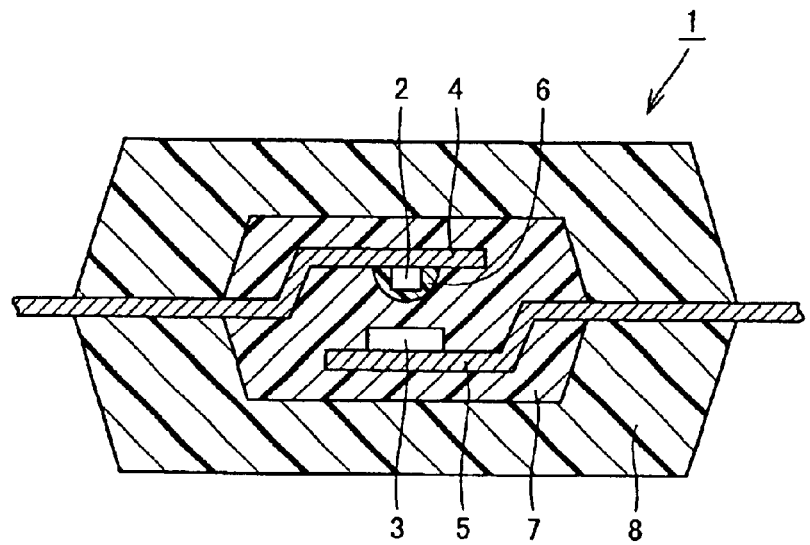
FIG. 7 is a schematic sectional view of a structures of a photocoupler (optically coupled device).
Figure 8:
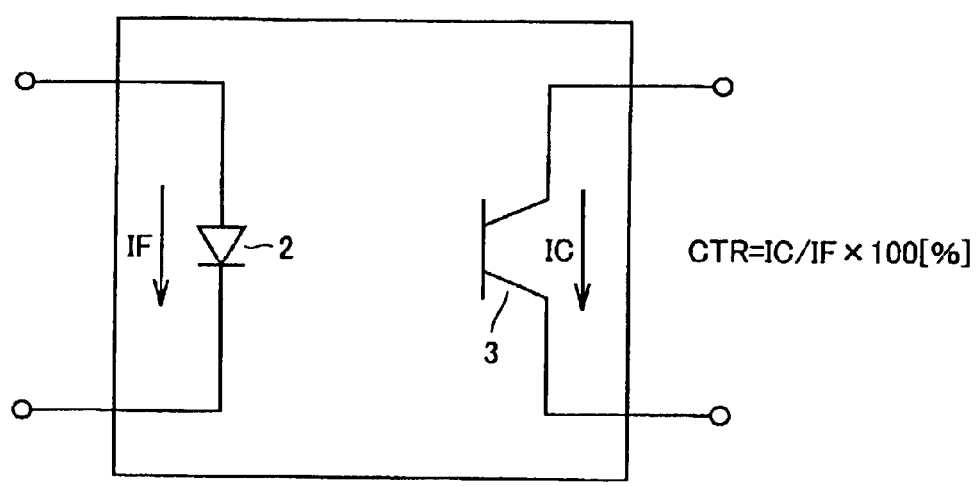
FIG. 8 shows a circuit structure of a photocoupler.
Figure 9:
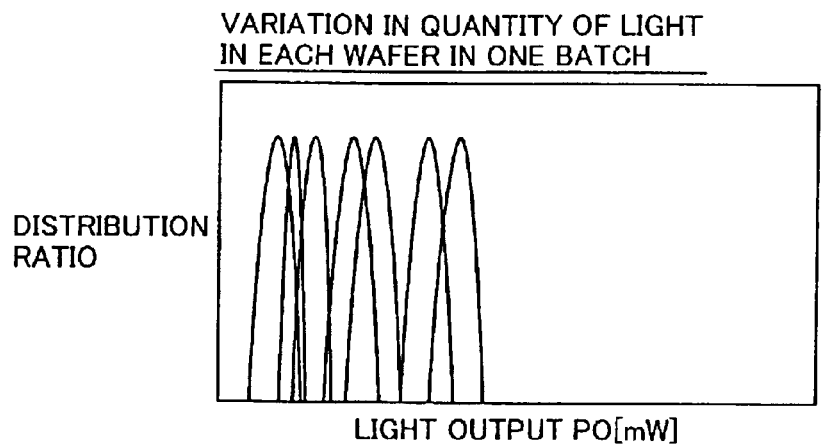
FIG. 9 is a graph of a quantity of light distribution of each wafer in one batch of infrared-emitting diodes.
Figure 10:
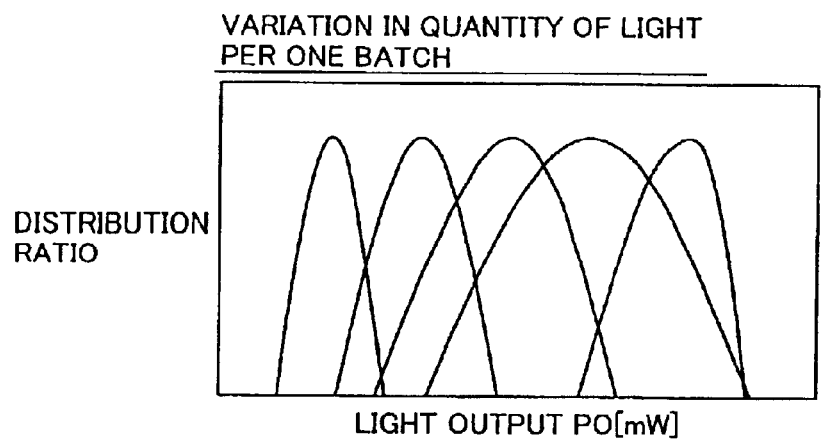
FIG. 10 is a graph of a quantity of light distribution of infrared-emitting diodes for one batch.
Figure 11:
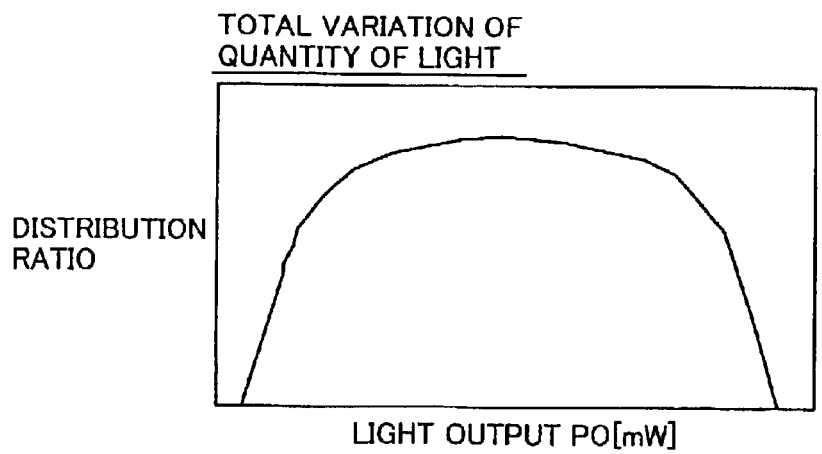
FIG. 11 is a graph of the total quantity of light distribution of infrared-emitting diodes.
Figure 12:
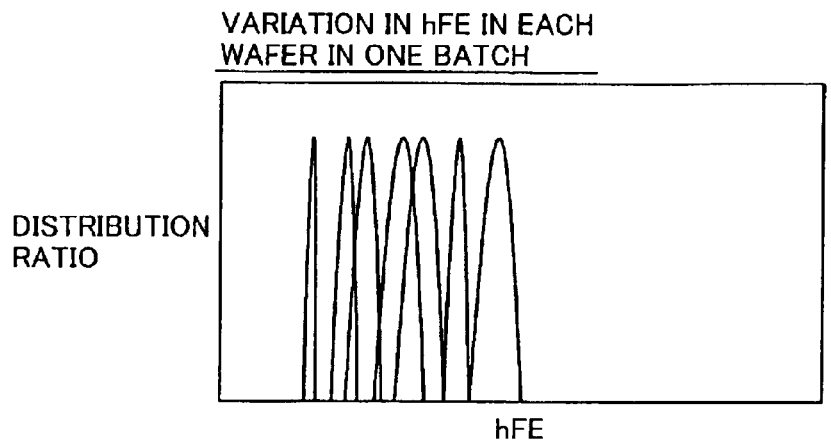
FIG. 12 is a graph of the hFE distribution of each wafer in one batch of phototransistors.
Figure 13:
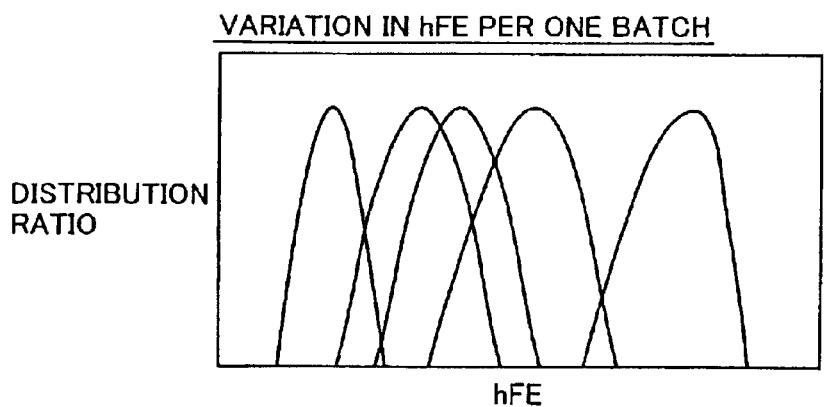
FIG. 13 is a graph of the hFE distribution of phototransistors per one batch.
Figure 14:
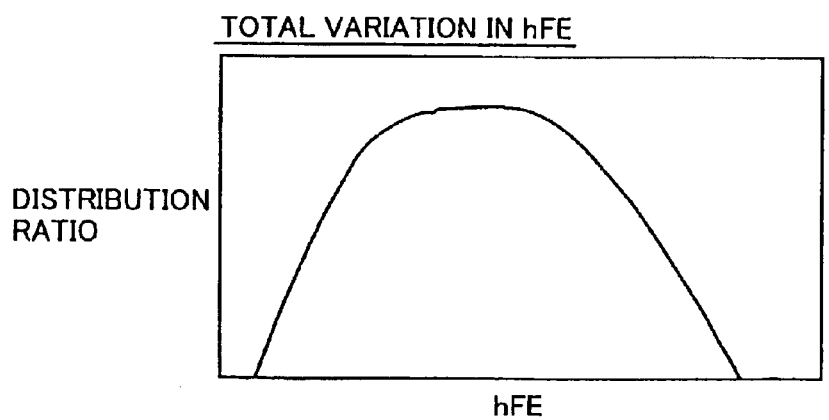
FIG. 14 is a graph of the total hFE distribution of phototransistors.

The flow chart of FIG. 6 is similar to the flow chart of FIG. 5 corresponding to the first embodiment with the exception that steps S2, S3, S12 and S13 are canceled.

In the photocoupler fabrication method of the present embodiment, the characteristic data (PO data) of infrared-emitting diode 2 and the characteristic data (hFE) data of phototransistor 3 are respectively measured after infrared-emitting diode 2 is die-bonded to frame 4 and phototransistor 3 is die-bonded to frame 5.

Accordingly, there are the advantages set forth below when the manufacturing company of infrared-emitting diode 2 and the manufacturing company of phototransistor 3 differ from the manufacturing company of photocoupler 1.

Specifically, if there is a specification or the like obtained when infrared-emitting diode 2 and phototransistor 3 are respectively delivered, it is possible to determine which of infrared-emitting diode 2 and phototransistor 3 has inferior performance based on respective test data of infrared-emitting diode 2 and phototransistor 3 subjected to die-bonding.

If is therefore possible to award a penalty to the company that has delivered infrared-emitting diode 2 and phototransistor 3 products of inferior performance.

In the photocoupler fabrication method of the present embodiment, the characteristic data (CTR data) of photocoupler 1 is fed back to the manufacturing plant of infrared-emitting diode 2 or the manufacturing plant of phototransistor 3.

Based on the feedback data, it is possible to request the manufacturing plant of infrared-emitting diode 2 or phototransistor 3 to fabricate an infrared-emitting diode 2 or phototransistor 3 that has the characteristics required for photocoupler 1. As a result, the performance of the photocoupler can be regulated at the photocoupler manufacturing plant side so that the CTR value of photocoupler 1 is within a particular range.

For example, consider the case where only infrared-emitting diodes 2 of high P0 value are delivered to the photocoupler fabrication plant although a photocoupler 1 of a small CTR value is desired. The number of a photocouplers 1 with a high CTR value will be increased.

In this case, the CTR yield data is fed back to the manufacturing plant of infrared-emitting diode 2, and the manufacturing plant of infrared-emitting diode 2 is requested to produce infrared-emitting diodes 2 of a small P0 value. Accordingly, a photocoupler 1 of a small CTR value can be fabricated.

Furthermore, consider the case where only phototransistors 3 of low hFE value are delivered to the photocoupler manufacturing plant although a photocoupler 1 with a high CTR value is required. The number of photocouplers 1 with a small CTR value will be increased.

In this case, the CTR yield data is fed back to the manufacturing plant of phototransistor 3. Based on the feedback data, the manufacturing plant of phototransistor 3 is requested to fabricate phototransistors 3 of a high hFE value. Thus, a photocoupler 1 of a high CTR value can be produced.

The characteristic data of infrared-emitting diode 2 or the characteristic data of photocoupler 3 may be stored in a storage device that can be accessed by respective manufacturing plants of infrared-emitting diode 2, phototransistor 3, and photocoupler 1 through a computer network such as the Internet.

Accordingly, the characteristic data of infrared-emitting diode 2, phototransistor 3 or photocoupler 1 obtained at respective stages of the photocoupler fabrication process can easily be fed back to another stage in the process by means of a network.

The method of fabricating an optically coupled device of the above embodiments is described based on a photocoupler including a infrared-emitting diode as the photoemitter and a phototransistor as the photodetector.

The technical concept of the photocoupler fabrication method of the first and second embodiments can be applied to the fabrication method of another optically coupled device such as a phototriac coupler, a photothyristor coupler or a photointerruptor to achieve advantages similar to those of the photocoupler fabrication method of the first and second embodiments.

In the method of fabricating other optically coupled devices, a semiconductor visible light photoemitter or a semiconductor laser chip may be employed as the photoemitter. Furthermore, a photodiode, a photo Darlington transistor, a phototriac, a photothyristor, a photoMOS or a photoIC may be employed as the photodetector.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating an optically coupled device having an assembly of a photoemitter emitting light of a predetermined level according to a flow of an input current and a photodetector receiving light emitted from said photoemitter to provide an output current, comprising:

one or more current transmission rate calculation steps of calculating a current transmission rate which is a ratio of said output current to said input current under a presumptive assembly condition, and one or more determination steps of determining whether said current transmission rate of each of said one or more current transmission rate calculation steps is a value within a particular range, wherein, when determination is made that said current transmission rate is not a value within said particular range at each of said one or more determination steps, said presumptive assembly condition is modified to another assembly condition so that said current transmission rate becomes a value within said particular range or approximates said particular range, and said one or more determination steps is conducted until said current transmission rate becomes a value in said particular range, said photoemitter and said photodetector being assembled eventually under an assembly condition where said current transmission rate becomes a value in said particular range.

2. The method of fabricating an optically coupled device according to claim 1, wherein, when determination is made that said current transmission rate is a value within said particular range at the first determination step of said one or more determination steps, said photoemitter and said photodetector are assembled under said presumptive assembly condition without carrying out the next determination step.

3. The method of fabricating an optically coupled device according to claim 1, comprising:

an arriving light quantity measurement step of measuring a quantity of the emitted light arriving at said photodetector, and an amplification factor measurement step of measuring an amplification factor which is a ratio of said output current to said quantity of arriving light, wherein said current transmission rate is calculated using a measured result of said arriving light quantity measurement step and a measured result of said amplification factor measurement step at said current transmission rate calculation step.

4. The method of fabricating an optically coupled device according to claim 3, wherein said arriving light quantity measurement step is conducted at a stage before said photoemitter is affixed to a frame, and said amplification factor measurement step is conducted at a stage before said photodetector is affixed to a frame.

5. The method of fabricating an optically coupled device according to claim 3, wherein said arriving light quantity measurement step is conducted at a stage after said photoemitter is affixed to a frame, and said amplification factor measurement step is conducted at a stage after said photodetector is affixed to a frame.

6. The method of fabricating an optically coupled device according to claim 1, wherein said presumptive assembly condition is modified by altering a state of at least one of a frame where said photoemitter is affixed and a frame where said photodetector is affixed.

7. The method of fabricating an optically coupled device according to claim 1, wherein said presumptive assembly condition is modified by altering a particular resin having a predetermined translucence provided between said photoemitter and said photodetector to another resin having a different translucence.

8. The method of fabricating an optically coupled device according to claim 1, wherein said presumptive assembly condition is modified by altering the length of a particular resin provided between said photoemitter and said photodetector in a direction connecting said photoemitter and said photodetector.

9. The method of fabricating an optically coupled device according to claim 1, wherein said photoemitter is any of a semiconductor infrared photoemitter, a semiconductor visible light photoemitter and a semiconductor laser device.

10. The method of fabricating an optically coupled device according to claim 1, wherein said photodetector is any of a photodiode, phototransistor, a photo Darlington transistor, a phototriac, a photothyristor, a photoMOS and a photoIC.

11. The method of fabricating an optically coupled device according to claim 1, wherein said optically coupled device is any one of a photocoupler, a phototriac coupler, a photothyristor coupler and a photointerrupter.

* * * * *